United States Patent [19]

Tabin

[11] Patent Number: 5,038,067

[45] Date of Patent: Aug. 6, 1991

[54] ACOUSTIC TRANSDUCER

[75] Inventor: Jozef Tabin, Peterborough, Canada

[73] Assignee: Federal Industries Industrial Group Inc., Toronto, Canada

[21] Appl. No.: 524,915

[22] Filed: May 18, 1990

[51] Int. Cl.[5] .............................................. H01L 41/08

[52] U.S. Cl. .................................... 310/334; 310/321; 310/322; 310/323; 310/324; 310/326; 310/328; 310/369; 367/165

[58] Field of Search ................................ 310/321-324, 310/326, 328, 334, 369; 367/152, 157, 165

[56] References Cited

U.S. PATENT DOCUMENTS

| | | | |
|---|---|---|---|
| 2,406,767 | 9/1946 | Hayes | 177/386 |
| 2,567,407 | 9/1951 | Slaymaker | 310/328 |
| 2,774,892 | 5/1951 | Camp | 310/322 |
| 2,961,636 | 11/1960 | Benecke | 310/322 |
| 3,150,347 | 9/1964 | Hanish | 367/155 |
| 3,284,761 | 11/1966 | Douglas | 367/155 |
| 3,370,186 | 2/1965 | Antonevich | 310/326 |
| 3,525,071 | 8/1970 | Massa | 367/157 |
| 3,674,945 | 7/1972 | Hands | 179/110 A |
| 3,859,984 | 1/1975 | Langley | 310/334 |
| 3,952,216 | 4/1976 | Madison et al. | 310/326 |
| 4,004,266 | 1/1977 | Cook et al. | 367/155 |
| 4,011,472 | 3/1977 | Feng | 310/328 |
| 4,122,725 | 10/1978 | Thompson | 73/632 |
| 4,183,007 | 1/1980 | Baird | 367/119 |
| 4,211,948 | 7/1980 | Smith et al. | 310/322 |
| 4,297,607 | 10/1981 | Lynnworth et al. | 310/334 |
| 4,333,028 | 6/1982 | Panton | 310/326 |
| 4,523,122 | 6/1985 | Tone et al. | 310/334 |
| 4,651,044 | 3/1987 | Kompanek | 310/334 |
| 4,672,591 | 6/1987 | Breimesser et al. | 310/334 |
| 4,751,419 | 6/1988 | Takahata | 310/322 |
| 4,928,263 | 5/1990 | Armstrong et al. | 367/157 |

FOREIGN PATENT DOCUMENTS 2186465A 8/1987 United Kingdom .

*Primary Examiner*—Mark O. Budd
*Assistant Examiner*—Thomas M. Dougherty
*Attorney, Agent, or Firm*—Ridout & Maybee

[57] ABSTRACT

A broadly tuned transducer system for pulse echo ranging systems has a rigid plate, to a planar radiating front surface of which is applied at least one layer of acoustic coupling material having a density intermediate between that of the plate and an atmosphere into which the transducer is to be coupled. Three or more driver assemblies spaced apart in a two dimensional array are ridigly secured to a rear surface of the plate, each assembly having a loading block and a piezoelectric element compressed between the block and the plate. The driver assemblies all have the same resonant frequency on axes perpendicular to the plate and are driven in phase; they occupy not less than one-fifth and not more than four-fifths of the area of the rear surface of the plate, which is rigid enough to prevent the excitement of significant flexural oscillations. The arrangement permits the transducer to have a large planar radiating surface while using quite small piezoelectric elements.

9 Claims, 2 Drawing Sheets

ACOUSTIC TRANSDUCER

BACKGROUND OF THE INVENTION

1. Field of the Invention

This invention relates to acoustic transducers for use in pulse-echo ranging applications.

2. Review of the Art

U.S. Pat. No. 4,333,028 (Panton) issued June 1, 1982 discloses a transducer for use in such applications which provides good performance and has received widespread commercial acceptance. The Panton invention, as set forth in claim 25 of U.S. Pat. No. 4,333,028, provides a broadly tuned directional transducer system comprising a radiating plate having a higher flexural mode resonance at substantially the operating frequency of the system, a transducer element of much smaller effective area than the plate and coupled thereto, and coupling means formed of low-loss acoustic propagation material of much lower acoustic impedance than the plate and applied to alternate antinodal zones of the radiating surface thereof such as to avoid substantial cancellation in the far field of sound radiated from said alternate antinodal zones of the plate by sound radiated from the remaining antinodal zones of the plate. Various different ways in which this invention can be implemented are described, depending variously on enhancing or reducing radiation from alternate antinodal zones as compared to adjacent antinodal zones, and/or adjusting the phase of radiation from adjacent antinodal zones to reduce or eliminate far-field cancellation. A particular advantage of the Panton transducer is that, as compared to transducers of previous designs, for example those disclosed in U.S. Pat. No. 3,674,945, (Hands), issued July 4, 1972, it utilizes very much smaller quantities of piezoelectric material, particularly in transducers operating at low frequency. This in turn permits the cost and weight of the transducer to be greatly reduced without any performance penalty. It has however been found that, in certain industrial environments involving high temperatures and/or chemically aggressive atmospheres, the low loss acoustic coupling materials utilized to couple the transducer to the atmosphere, which are usually fabricated from foamed synthetic plastics or rubbers, can be subject to unacceptably rapid deterioration in service. In some applications, this latter problem has required the use of transducers of the older design, despite the substantial cost and weight penalty.

In an endeavour to overcome the problems involved in forming the coupling means of the Panton transducer from foam materials, United Kingdom Patent Application No. 2186465A (Endress & Hauser), published Aug. 12, 1987, discloses a version of the Panton transducer as set forth above in which a grid is applied to the front of the radiating plate so as to define concentric rings and channels, the rings and channels being in front of alternate antinodal zones of the plate. The channels contain shaped bodies of air applied to the plate, which bodies provide the coupling means formed from low loss acoustic propagation material having a much lower acoustic impedance than the plate. The rings, which are not mechanically coupled to the plate, block radiation from the remaining alternate antinodal zones. Since the channels in the grid configure the air which they contain so that the latter provides the required coupling means. There is no necessity for using vulnerable foamed materials: the grid itself, which acts largely as a mask, may be made from heat and corrosion resistant material. On the other hand, the confinement of a portion of the ambient atmosphere to form the coupling means provides less than ideal coupling between the plate and the far field, making it more difficult to control ringing of the transducer. It is also difficult to ensure that material does not become lodged between the grid and the radiating plate, with severe effects upon the performance of the transducer, whilst multiple reflections between the radiating plate and the grid may also degrade transducer performance.

It is known to increase the effective area of an axial mode transducer by applying to its front surface a frustoconical radiating plate and a loading plate: U.S. Pat. No. 4,183,007 (Baird) issued June 8, 1980 is exemplary of such transducers. There are however fairly severe limits upon the extent to which the size of the radiating surface can be extended in this manner, since the periphery of the radiating plate will commence to produce flexural mode responses with deleterious effects on transducer performance and polar response.

Besides the Hands patent mentioned above, various proposals have been made for transducer assemblies comprising multiple transducer arrays in which the transducers are operated in unison or near unison in order to provide the effect of a single much larger transducer, and/or to enable manipulation of the polar radiation pattern of the transducer. Examples of such transducers are disclosed in U.S. Pat. Nos. 2,567,407 (Slaymaker), 4,122,725 (Thompson), and 4,211,948 (Smith et al). Although such array may be provided with common matching layers, the transducers operate essentially independently, and a large quantity of piezoelectric material is required. U.S. Pat. No. 2,406,767 shows, in FIG. 10, an array of closely adjacent piezoelectric transducers submerged in liquid between front and rear plates. Shear effects in the liquid together with the closeness of the transducers are relied upon to maintain phase coherence and piston like operation of the plates. Again, a large quantity of piezoelectric material is required, the elements having together substantially the same area as that of the radiating plate of the transducer.

It is also known to provide the matching layer of a transducer with a protective membrane: in addition to the Hands patent already mentioned, exemplary arrangements are shown in U.S. Pat. No. 4,297,607 (Lynnworth et al), who also show in FIG. 5 a multi-transducer array of the type already discussed, and U.S. Pat. No. 4,523,122 (Tone) (see FIG. 2).

SUMMARY OF THE INVENTION

An object of the present invention is to provide a transducer which can, to a substantial degree, retain the cost, weight and performance advantages of the Panton transducer, but which at the same time is more robust and better suited to use in high temperature and chemically aggressive environments.

Accordingly the invention provides a broadly tuned directional transducer system for pulse-echo ranging systems comprising a substantially rigid plate having a substantially planar radiating front surface, coupling means applied to the radiating surface and comprising at least one layer of acoustic propagation material of acoustic impedance intermediate between that of the material of the plate and that of an atmosphere into which the plate is to radiate, at least three spaced apart driver assemblies rigidly secured to an opposite surface of the plate, each driver assembly comprising a loading block, a piezoelectric element between the loading block and the plate, and means maintaining the piezoelectric element acoustically coupled to the plate and to the loading block state of compression therebetween, each driver assembly having substantially the same resonant frequency as the others on an axis perpendicular to the radiating surface of the plate, and means establishing electrical connections to the piezoelectric transducers to permit excitement of the latter in phase with one another, substantially at their resonant frequencies and on said perpendicular axes, the rigidity of the plate and the proximity of the driver assemblies being sufficient to prevent the excitement of significant flexural oscillations in the plate.

Further features of the invention will be apparent from the following description of a preferred embodiment thereof with reference to the accompanying drawings.

SHORT DESCRIPTION OF THE DRAWINGS

DESCRIPTION OF THE PREFERRED EMBODIMENTS

Figure 1:
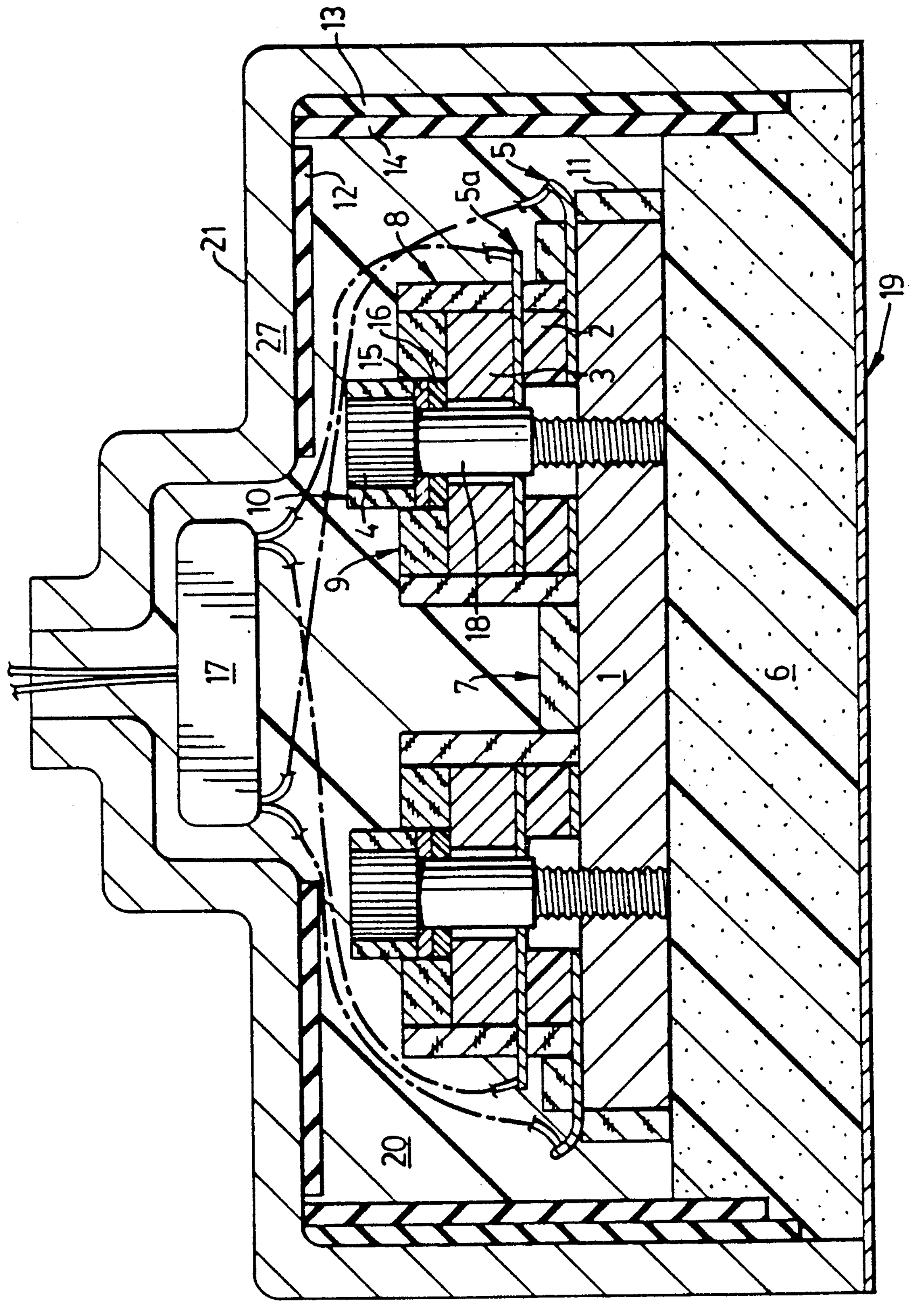
FIG. 1 is a diametrical cross-section through a transducer system in accordance with the invention.

Referring to FIG. 1, a transducer system is based upon a thick rigid circular plate 1, typically of aluminum. The dimensions of the plate will vary according to the frequency and beamwidth of the transducer. For example, the plate may be 2 cm thick and 20 cm in diameter for a transducer operating at 22 kHz; other dimensions given hereafter are based upon these, and are exemplary only. The plate is drilled and tapped at four points, spaced 5 cm from the centre of the plate and arrayed at the corners of a square concentric with the plate, to receive screws 4 used to secure piezoelectric elements 2 and steel loading blocks 3 to the plate. The piezoelectric elements and steel loading blocks are each cylindrical with a central bore to pass the shank of a screw 4 and form a symmetrical arrangement of four driver assemblies secured by the screws 4 to the plate 1. Conductive washers 5 and 5*a* with integral solder tabs at their periphery are located between the elements 2 and both the plate 1 and the loading blocks 3, whilst a lock washer 15 and an insulating washer 16 are placed between the head of each screw 4 and its associated loading block 3. The insulating washer 16, together with an insulating sleeve 18 which may be shrunk onto the shank of the screw, prevents the screw from establishing a short circuit between the conductive washers 5 and 5*a*. The washers 5 are connected together and to one terminal of the secondary of a matching transformer 17, and the washers 5A are connected together and to the other terminal of the transformer secondary. This enables the piezoelectric elements 2 to be energized, for vibration in an axial mode, simultaneously and in parallel, by the application of an alternating potential to the primary of the transformer 17 at a frequency which equals or is close to the resonant frequency of each assembly formed by a loading block 3 and an element 2 secured by a screw 4 to the plate 1.

The screws 4 are torqued so that, even when the elements 2 are energized at a maximum rated potential of the device, and even at extremes of the rated temperature range of the device, the elements 2 remain under compression. This prevents distortion of the oscillatory waveform produced by the assembly through momentary loss or variation of acoustic coupling between the parts, and reduces the risk of fracture of the elements 2.

The side and rear surfaces of the transducer system are wrapped with layers 7, 8, 9, 10 and 11 of vibration damping material, preferably cork, and located within an open-fronted housing 21 by being embedded in a potting compound 20, tYpically an epoxy resin. LaYers 12, 13 and 14 of cork or silicone rubber are located between the resin 20 and the housing to provide further vibration damping. A coupling layer 6 is formed in front of the plate either by pouring a foamable resin into the housing, and foaming and curing the resin in situ, or by adhesively applying a layer of a rigid, closed celled foam selected so as to withstand temperatures to which the system is likely to be subjected. The layer may be formed from a single bulk material or a composite layer formed of two or more physically different materials either laminated or admixed. The layers may be provided with an integral or separately formed protective membrane resistant to aggressive chemicals: for example, the coupling layer may be machined and covered by a thin membrane 19 in the form of a protective layer of impervious material such as stainless steel. The protective membrane may be specified so as to meet regulations applicable to transducers for operation in explosive atmospheres. In each case, the configuration is selected to provide effective coupling, typically arranging that the coupling layer represents, together with any membrane layer, the equivalent of a quarter wavelength matching layer at the resonant frequency of the transducer system; its effective acoustic impedance should be intermediate between that of the plate 1 and the ambient atmosphere, thus providing impedance matching in a manner similar to that provided by the Hands patent discussed above.

The thickness of the plate 1, and the relatively close spacing of the driver assemblies, together with their operation in synchronism, result in the plate oscillating with a piston like action, without any substantial flexural mode response, comparable to that produced by a single very large cylindrical piezoelectric element, or an array of large elements energized in unison. The provision of the relatively massive plate 1 and the massive loading blocks 3 enables the resonant frequency of the system in the axial mode to be reduced very substantially, as compared to that of the relatively small piezoelectric elements 2 when unloaded, to a level comparable to that achieved by using a relatively thin plate operating in flexural mode as in the Panton patent. Whilst the use of multiple driver assemblies together with the thick plate 1 and the loading blocks 3 means that the reduction in weight and in the use of piezoelectric material is not quite as spectacular as that achieved by the Panton transducer assembly, it is sufficient that neither the mass of the unit nor the amount of piezoelectric material utilized presents a significant problem.

The loading blocks 3 are preferably but not necessarily of steel, which is cheap, strong and massive, whilst the plate 1 is preferably of aluminum so that the necessary flexural resistance may be achieved without unduly increasing the mass of the plate. If too much of the mass of the assembly is concentrated in the plate, as opposed to the loading blocks, this will reduce the amplitude of radiation from the plate. In transducers operating over a very wide temperature range, it may be advantageous to sèlect the materials used to compensate for thermal expansion effects.

Figure 3:
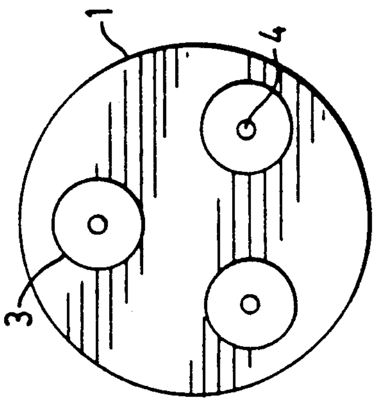
FIGS. 2–5 are diagrammatic rear views of transducer systems in accordance with the invention, without their outer casings, illustrating different arrangements of driver assemblies within the system.
Figure 5:
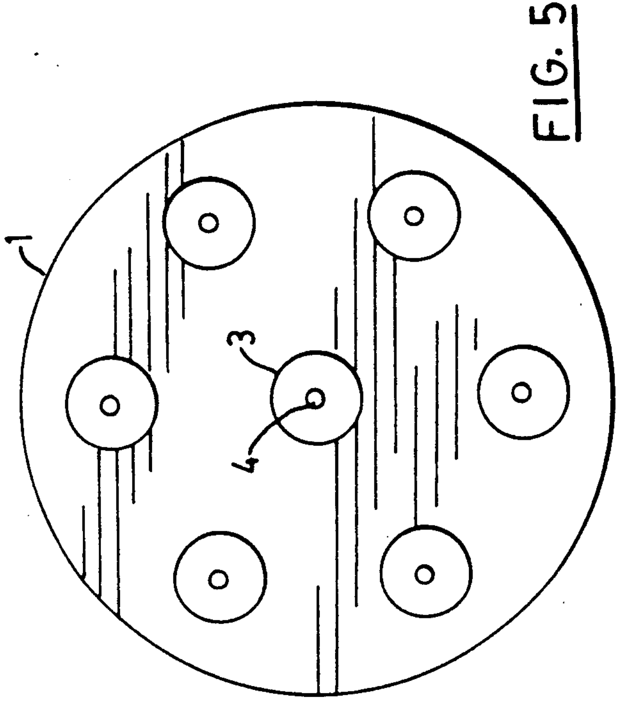
Figure 2:
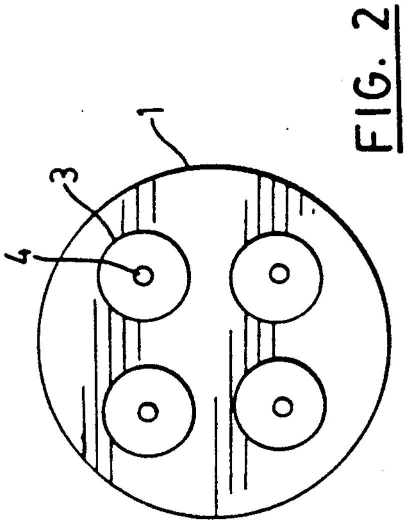
Figure 4:
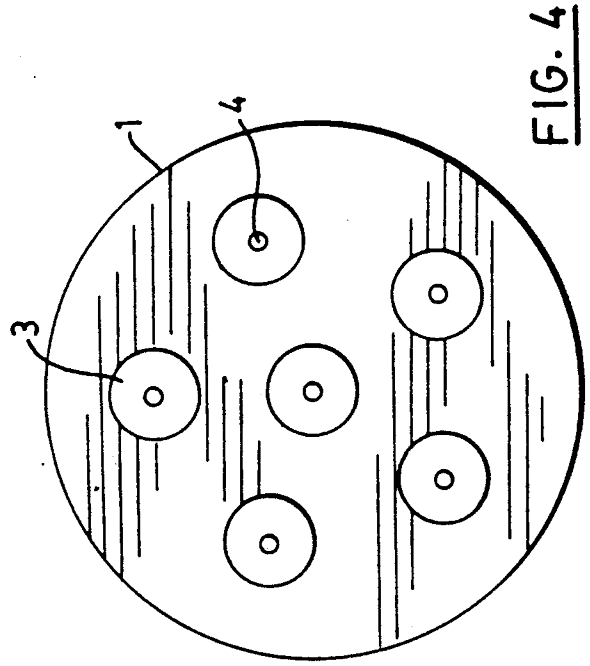

According to the size of the elements 2 and the loading blocks 3, the diameter of the plate 1 and the desired frequency of operation, arrangements of the driver assemblies other than that shown in FIG. 2 may be employed. Thus in FIG. 3, only 3 driver assemblies are employed, arranged at the apices of an equilateral triangle concentric with the plate, whilst in FIGS. 4 and 5 respectively six and seven assemblies are used, with one assembly at the centre of the plate and the remainder distributed around it in a ring.

In order to avoid the generation of excessive flexural vibration of the plate 1, it is preferable to observe certain dimensional relationships. Firstly, the piezoelectric elements 2 should have a size and number such as to engage at least one fifth and less than four fifths of the area of the rear surface of the plate 1. Secondly, no more than one sixth of the area of the rear surface of the plate should be distant from an element 2 by more than $$0.27\sqrt{fh\sqrt{\frac{E}{w(1-q^2)}}}$$

where f is the frequency of operation, h is the thickness of the plate 1, and E, q and w are respectively the Young's modulus, the Poisson's ratio and the specific gravity of the material of the plate.

I claim:

1. A broadly tuned directional transducer system for pulse-echo ranging systems comprising a substantially rigid circular plate having a substantially planar radiating front surface; coupling means applied to the radiating surface and comprising at least one layer of acoustic propagation material of acoustic impedance intermediate between that of the material of the plate and that of an atmosphere into which the plate is to radiate; at least three driver assemblies spaced apart in a two dimensional array upon and rigidly secured in a symmetrical arrangement to an opposite surface of the plate, each driver assembly comprising a loading block, a piezoelectric element between the loading block and the plate, and means maintaining the piezoelectric element acoustically coupled to the plate and to the loading block, and each driver assembly having substantially the same resonant frequency as the others on an axis perpendicular to the radiating surface of the plate; and means establishing electrical connections to the piezoelectric elements of the driver assemblies to permit excitement of the latter in phase with one another substantially at their resonant frequency and on said perpendicular axes; the rigidity of the plate and the proximity of the driver assemblies being sufficient to prevent the excitement of significant flexural oscillations in the plate; wherein the driver assemblies are spaced from each other and from the periphery of the plate such that the transducer elements cover at least one fifth but less than four fifths of the area of the rear surface of the plate.

2. A transducer system according to claim 1, wherein the driver assemblies are three in number with their axes at the apices of an equilateral triangle concentric with the plate.

3. A transducer system according to claim 1, wherein the driver assemblies are four in number with their axes at the corners of a square concentric with the plate.

4. A transducer system according to claim 4, wherein the driver assemblies are five to eight in number, with one assembly at the centre of the plate and the remainder surrounding it in a concentric ring.

5. A transducer system according to claim 1, further including a rigid enclosure open at its front surrounding the plate and the driver assemblies, the acoustic coupling means attached to the radiating surface including an environmental seal across the open front of the enclosure.

6. A transducer system according to claim 5, wherein the coupling means incorporates an external membrane resistant to atmospheric conditions expected to be encountered by the transducer.

7. A transducer system according to claim 5, wherein the means establishing electric connections to the piezoelectric elements includes a transformer encapsulated within the housing.

8. A transducer system according to claim 1, wherein the bolts are provided with insulative washers and sleeves to prevent their establishing short circuits between the loading blocks and the plates.

9. A broadly tuned directional transducer system for pulse-echo ranging systems comprising a substantially rigid circular plate having a substantially planar radiating front surface; coupling means applied to the radiating surface and comprising at least one layer of acoustic propagation material of acoustic impedance intermediate between that of the material of the plate and that of an atmosphere into which the plate is to radiate; at least three driver assemblies spaced apart in a two dimensional array upon and rigidly secured in a symmetrical arrangement to an opposite surface of the plate, each driver assembly comprising a loading block, a piezoelectric element between the loading block and the plate, and means maintaining the piezoelectric element acoustically coupled to the plate and to the loading block, and each driver assembly having substantially the same resonant frequency as the others on an axis perpendicular to the radiating surface of the plate; and means establishing electrical connections to the piezoelectric elements of the driver assemblies to permit excitement of the latter in phase with one another substantially at their resonant frequency and on said perpendicular axes; the rigidity of the plate and the proximity of the driver assemblies being sufficient to prevent the excitement of significant flexural oscillations in the plate; wherein at least five sixths of the area of rear surface of the plate is distant from a transducer element by less than $$0.27\sqrt{fh\sqrt{\frac{E}{w(1-q^2)}}}$$

where f is the frequency of operation of the transducer, h is the thickness of the plate, and E, q and w are respectively the Young's modulus, the Poisson's ratio and the specific gravity of the material of the plate.

* * * * *